(12) United States Patent
Aton et al.

(10) Patent No.: US 9,343,332 B2
(45) Date of Patent: May 17, 2016

(54) ALIGNMENT TO MULTIPLE LAYERS (71) Applicant: Texas Instruments Incorporated, Dallas, TX (US)

(72) Inventors: Thomas John Aton, Dallas, TX (US); Steven Lee Prins, Fairview, TX (US); Scott William Jessen, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/803,538

(22) Filed: Jul. 20, 2015

(65) Prior Publication Data

US 2015/0325472 A1   Nov. 12, 2015

Related U.S. Application Data (62) Division of application No. 13/479,951, filed on May 24, 2012, now Pat. No. 9,117,775.

(60) Provisional application No. 61/489,922, filed on May 25, 2011.

(51) Int. Cl.
| | |
|---|---|
| *H01L 21/3213* | (2006.01) |
| *H01L 21/768* | (2006.01) |
| *H01L 21/283* | (2006.01) |
| *G03F 1/42* | (2012.01) |
| *G03F 9/00* | (2006.01) |
| *H01L 21/28* | (2006.01) |
| *H01L 21/311* | (2006.01) |
| *H01L 23/544* | (2006.01) |
| *H01L 29/66* | (2006.01) |

(52) U.S. Cl.
CPC ............ *H01L 21/32139* (2013.01); *G03F 1/42* (2013.01); *G03F 9/7084* (2013.01); *H01L 21/283* (2013.01); *H01L 21/28123* (2013.01); *H01L 21/31144* (2013.01); *H01L 21/76816* (2013.01); *H01L 21/76877* (2013.01); *H01L 21/76897* (2013.01); *H01L 23/544* (2013.01); *H01L 29/6659* (2013.01); *H01L 2223/54426* (2013.01); *H01L 2223/54453* (2013.01); *H01L 2924/0002* (2013.01)

(58) Field of Classification Search
USPC .................................................. 257/620, 797
See application file for complete search history.

(56) References Cited

U.S. PATENT DOCUMENTS

| | | | |
|---|---|---|---|
| 6,987,053 B2 | 1/2006 | Wu et al. | |
| 7,221,060 B1 * | 5/2007 | Singh .................. | G03F 7/70625 257/797 |
| 2008/0113274 A1 * | 5/2008 | Lin .......................... | G03F 1/36 430/5 |
| 2010/0167513 A1 | 7/2010 | Blatchford | |
| 2011/0284966 A1 * | 11/2011 | Wen ................ | H01L 21/823456 257/368 |
| 2012/0025317 A1 | 2/2012 | Zhong et al. | |

* cited by examiner

*Primary Examiner* — Mohammad Islam
*Assistant Examiner* — Ratisha Mehta
(74) *Attorney, Agent, or Firm* — Jacqueline J. Garner; Frank D. Cimino (57) ABSTRACT

A method of aligning a new pattern to more than one previously defined pattern during the manufacture of an integrated circuit. A method of aligning a photolighography pattern reticle to a first previously defined pattern in a first direction and also aligning the photolithography pattern reticle to a second previously defined pattern in a second direction. A method of aligning a photolighography pattern reticle to two previously defined patterns in the same direction.

3 Claims, 15 Drawing Sheets

ALIGNMENT TO MULTIPLE LAYERS

CROSS-REFERENCE TO RELATED APPLICATIONS

This application is a divisional of U.S. Nonprovisional patent application Ser. No. 13/479,951, filed May 24, 2012 which claims the priority of U.S. Provisional Application Ser. No. 61/489,922, filed May 25, 2011, the contents of both of which are herein incorporated by reference in its entirety.

FIELD OF THE INVENTION

This invention relates to the field of integrated circuits. More particularly, this invention relates to the alignment of photoresist patterns during the manufacture of integrated circuits.

BACKGROUND OF THE INVENTION

The geometries in integrated circuits have scaled to smaller and smaller dimensions. As the geometries have scaled the alignment tolerance of a pattern level to underlying pattern levels has also become smaller and more critical.

In conventional integrated circuit flows, when a pattern such as active, gate, contact, metal, and via is formed on the integrated circuit wafer, alignment marks for alignment in the x-direction and alignment marks for alignment in the y-direction are formed on each of these layers so that subsequent patterns may be aligned using these alignment marks.

Figure 1:
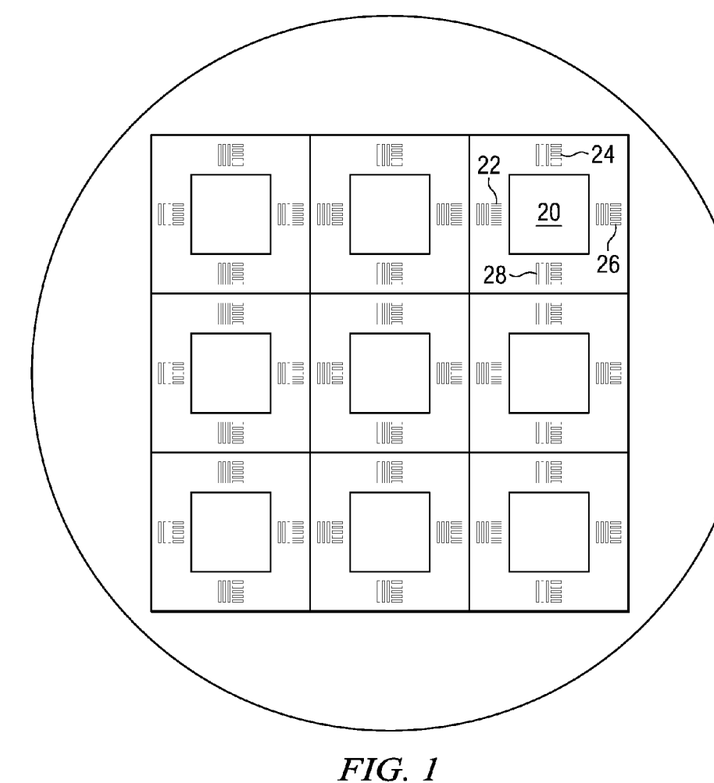
FIG. 1 (prior art) is a top down view of integrated circuit geometries and photolithography alignment marks formed on an integrated circuit
Figure 2:
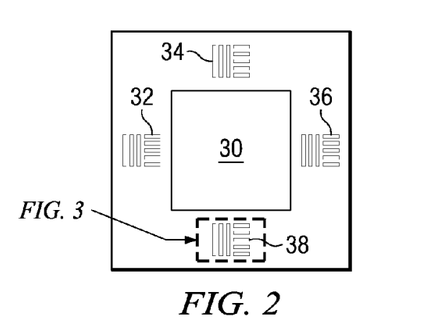
FIG. 2 is an integrated circuit photomask with photolithography alignment marks.
Figure 3:
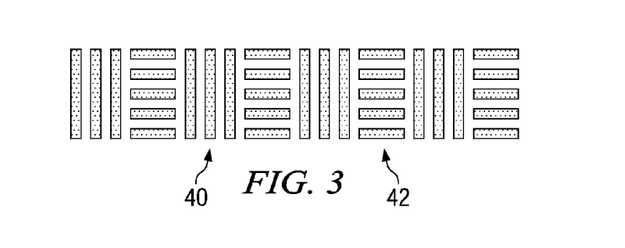
FIG. 3 is a photolithography alignment mark.

Conventional photolithographic alignment is illustrated in FIGS. 1-3. FIG. 1 shows an integrated circuit wafer with multiple integrated circuit chip 20 patterns formed on the wafer. For example, integrated circuit pattern 20 may be the active pattern etched into the integrated circuit wafer. When the active geometries are etched into the integrated circuit wafer active alignment marks 22, 24, 26, and 28 are also etched into the integrated circuit wafer. Typically the alignment marks consist of vertical 40 and horizontal 42 grids as shown in FIG. 3. When another integrated circuit pattern is to be printed on the integrated circuit wafer, it is critical for the new pattern geometries to be properly aligned to the active geometries already etched into the integrated circuit wafer. The reticle 30 illustrated in FIG. 2 may be an integrated circuit gate reticle, an integrated circuit contact reticle, or an integrated circuit implant pattern reticle. A gate reticle is used for illustration. The gate reticle is loaded into a photolithography stepper and the stepper aligns the gate alignment marks 32, 34, 36, and 38 that are on the gate reticle to the active alignment marks 22,24,26,28 that are etched in the integrated circuit wafer. The stepper aligns the gate reticle alignment marks in the x and y directions to the underlying active pattern alignment marks for each of the integrated circuit chips on the wafer. Vertical alignment grids 40 are used for horizontal alignment. Horizontal alignment grids 42 are used for vertical alignment.

An alignment tree for a typical integrated circuit aligns all photoresist pattern alignment marks prior to the contact level to the active x and y alignment marks, aligns the contact pattern alignment marks to the gate x and y alignment marks, aligns the first interconnect pattern alignment marks to the contact x and y alignment marks, aligns via pattern alignment marks to the underlying interconnect x and y alignment marks and aligns interconnect pattern alignment marks to the underlying via x and y alignment marks.

In addition, in order to pattern geometries with a pitch below about 100 nm while using 193 nm lithography, it has become necessary to use double pattern technology (DPT). Using DPT, one interconnect pattern with a pitch of about 100 nm may be split into two patterns each with a pitch of about 200 nm. The interconnect pattern with a 100 nm pitch may then be formed on an integrated circuit wafer by printing both patterns with the looser pitch into the same layer of photoresist.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A method of aligning a new pattern to more than one previously defined pattern during the manufacture of an integrated circuit. A method of aligning a new pattern reticle to a first previously defined pattern alignment mark in a first direction and also aligning said pattern to a second previously defined pattern alignment mark in a second direction. A method of aligning a new pattern reticle to two previously defined patterns alignment marks in the same direction.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Geometries in integrated circuits keep scaling to smaller dimensions. As the geometries scale the alignment tolerance of a new pattern level to previously defined pattern levels becomes smaller and more critical.

In addition, in order to pattern such small geometries while still using 193 nm lithography, it has become necessary to double pattern a number of lithography levels. For example, at the gate level one pattern may be used to define gate geometries that cross a number of diffusion areas and a second pattern may be used to cut the gate geometries between the diffusion areas to electrically isolate the transistor gates as shown in FIGS. 4A and 4B.

Figure 4A:
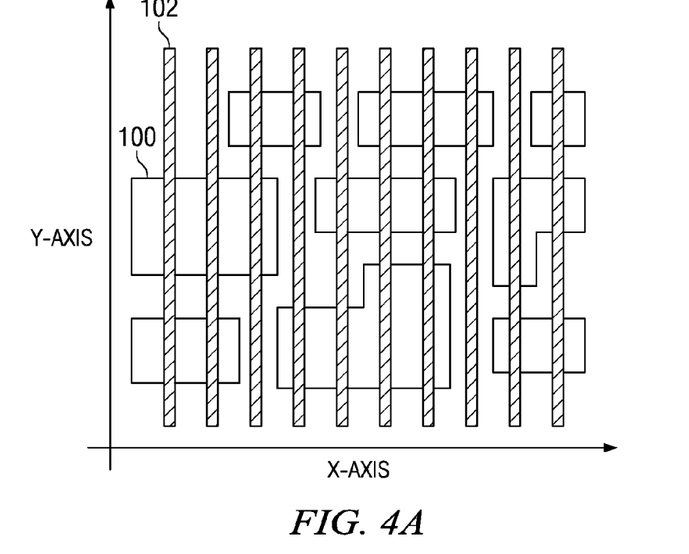
FIG. 4A-4C illustrates alignment of a gate cut pattern according to embodiments.
Figure 4B:
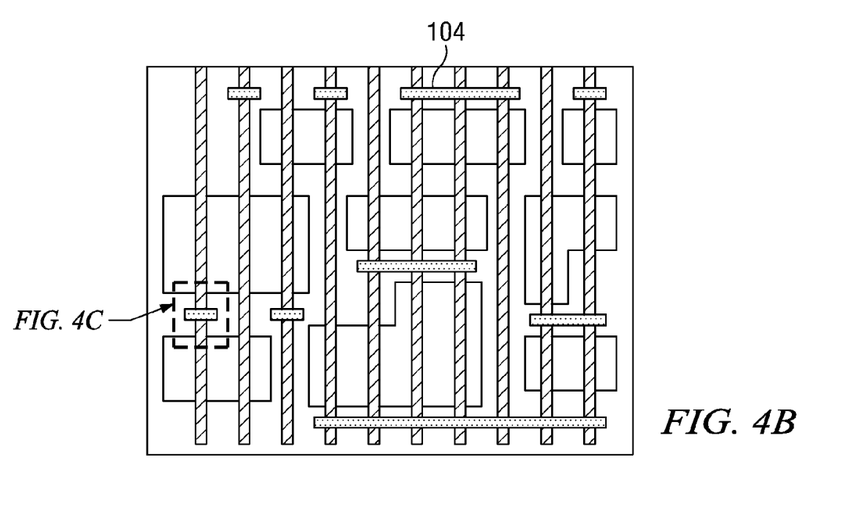

In FIG. 4A, all diffusion geometries 100, and all gate geometries, 102, are "Manhattan" geometries with edges aligned along either the x-axis or y-axis. In this example, the current flow in all transistors is parallel to the x-axis. The gate cut pattern (clear geometries), 104, shown in FIG. 4B cuts a section from the gate lines of the first gate lead pattern 102 to electrically separate the gates where needed. While alignment to the first gate lead pattern 102 is critical in the x-direction so that the gate leads are completely cut, alignment to the first gate lead pattern 102 in the y-direction is not critical. However, alignment to the diffusion geometries 100 in the y-direction is critical.

Figure 4C:
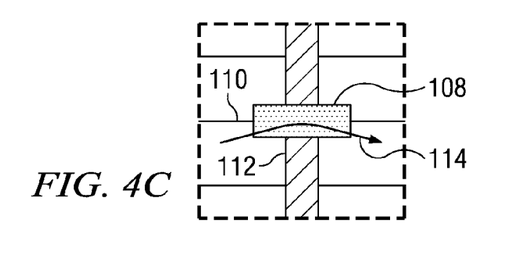

As shown in FIG. 4C if the gate cut pattern 108 is misaligned to active pattern 110 in the y-direction, the end of the gate 112 may not overlie the active/STI boundary causing a short to form between the transistor source and drain as indicated by the arrow 114. It is therefore, advantageous to align the gate cut pattern 104 in the x-direction to the first gate lead pattern 102 and to align the gate cut pattern 104 in the y-direction to the active pattern 100. By aligning the gate cut pattern in the x-direction to the first gate lead pattern, the shorting of two gates due to an incomplete gate cut is minimized and by aligning the gate cut pattern in the y-direction to active, shorting of a transistor source and drain due to a gate end overlying a diffusion area is minimized.

An example embodiment illustrating the alignment of double pattern interconnect levels in the x-direction using the x alignment marks from one underlying pattern and the y alignment marks from a second underlying pattern is illustrated in FIGS. 5A-5D, FIGS. 6A-6E, and FIGS. 7A-7D. FIGS. 5A-5B, FIGS. 6A and 6B, and FIGS. 7A-7C illustrate the alignment of a first interconnect double pattern (FIG. 7C) in the x-direction to the gate x alignment marks (FIG. 7A) and alignment in the y-direction to the contact y alignment marks (FIG. 7B). FIGS. 5A-5C, FIGS. 6A, 6B, 6C and FIGS. 7A-7D illustrate the alignment of a second interconnect double pattern (FIG. 7D) in the x-direction to the gate x alignment marks (FIG. 7A) and alignment in the y-direction to the first interconnect y alignment marks (FIG. 7C).

Figure 5A:
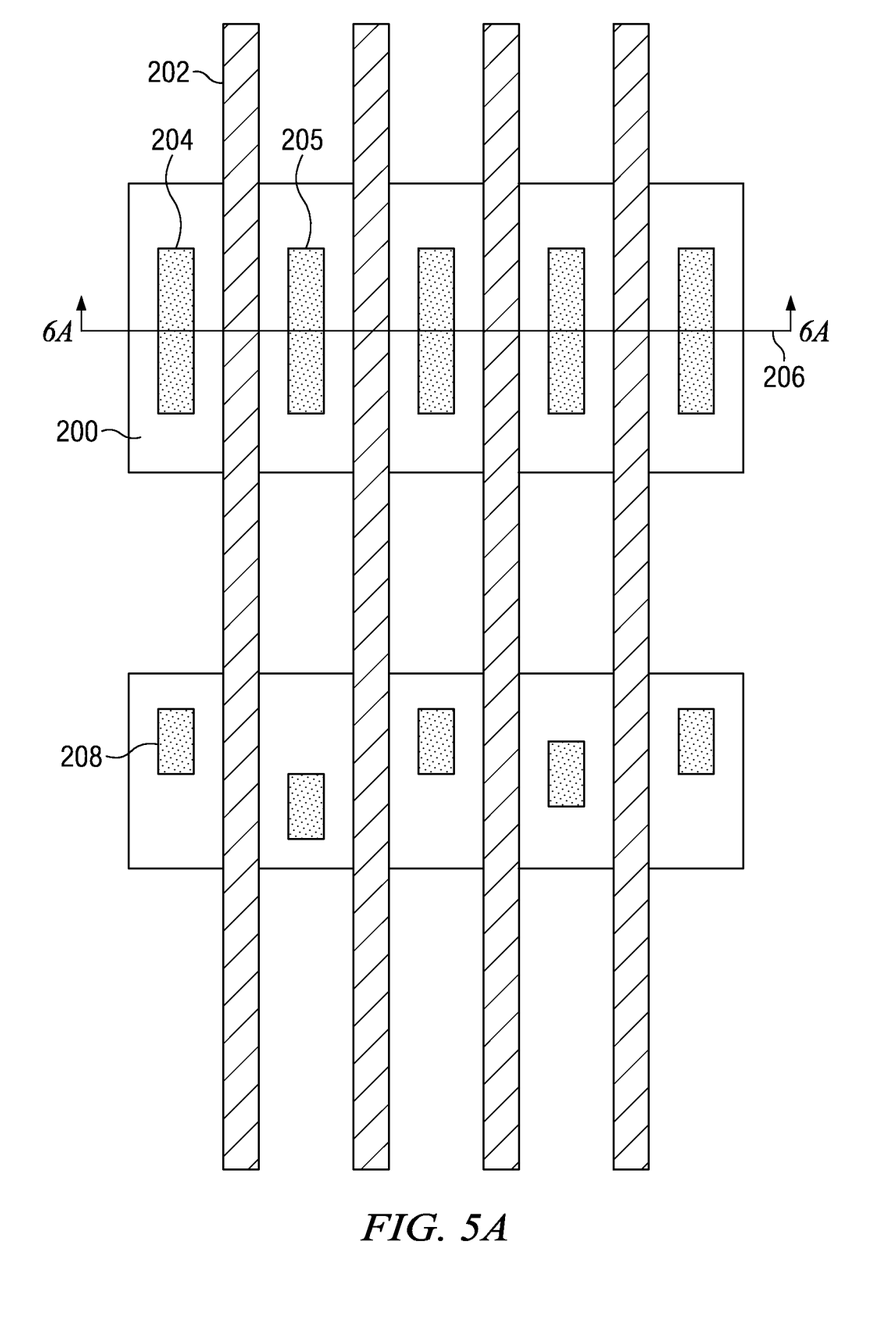
FIG. 5A-5D are top down pattern views illustrating alignment of a second interconnect double pattern according to embodiments.
Figure 6A:
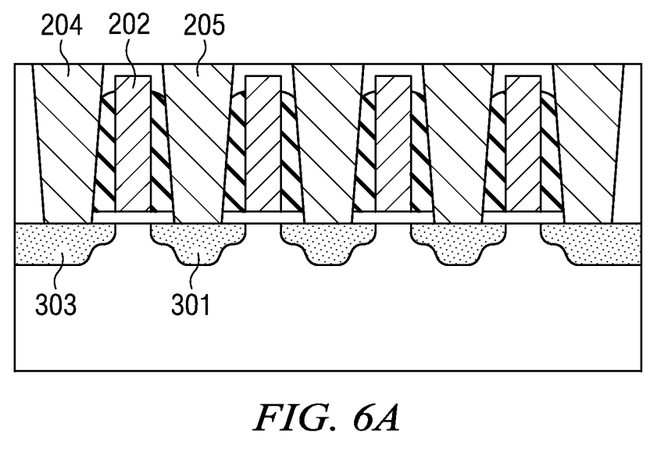
FIG. 6A-6E are cross section views illustrating alignment of a second interconnect double pattern according to embodiments.
Figure 7A:
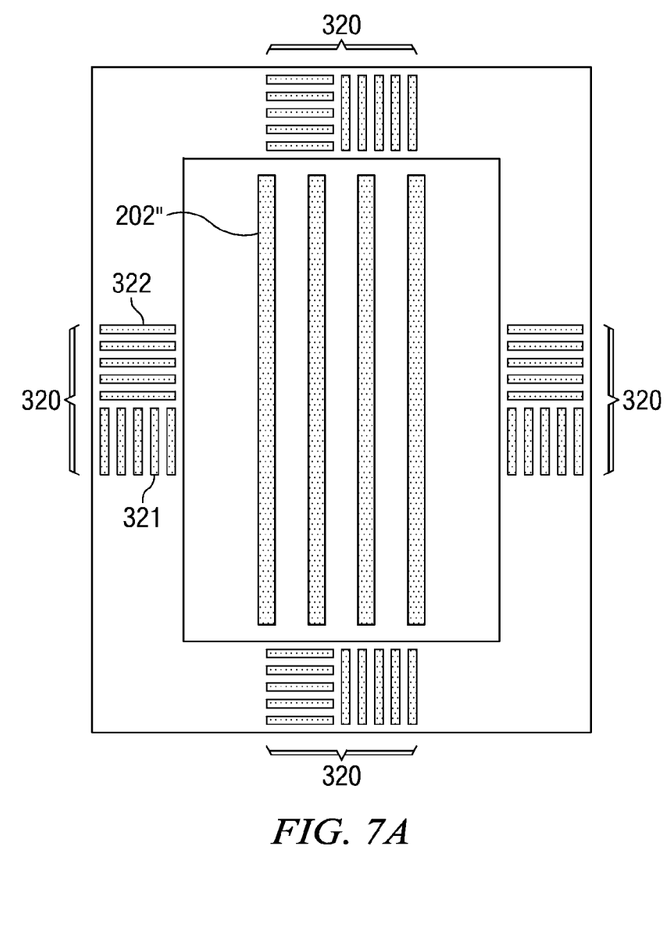
FIG. 7A-7D are integrated circuit pattern reticles with alignment marks.

FIG. 5A shows a top down view of active pattern 200, gate pattern (gates 202), and contact pattern (contact plugs 204, 205, 208). A cross section of the integrated circuit of FIG. 5A along line 206 is shown in FIG. 6A. Contact plugs 204 and 205 adjacent to transistor gate 202 form electrical contact to the transistor source 301 and drain 303 diffusions. FIG. 7A illustrates a reticle including a gate pattern 202" that may be used to pattern a layer of gate material (e.g., polysilicon) to form gates 202. The gate pattern reticle includes alignment marks 320 that are used to align the reticle. These alignment marks are transferred to the layer of gate material when forming gates 202. Alignment marks 320 include x-alignment marks 321 and y-alignment marks 322. FIG. 7B illustrates a reticle including contact pattern 204" and 208" that may be used to pattern a dielectric layer to form contact plugs 204, 205, 208. The contact pattern reticle includes alignment marks 340 that are used to align the reticle. These alignment marks are transferred to the contact level of the integrated circuit when forming contacts 204, 205, and 208. Alignment marks 340 include x-alignment marks 341 and y-alignment marks 342.

Figure 5B:
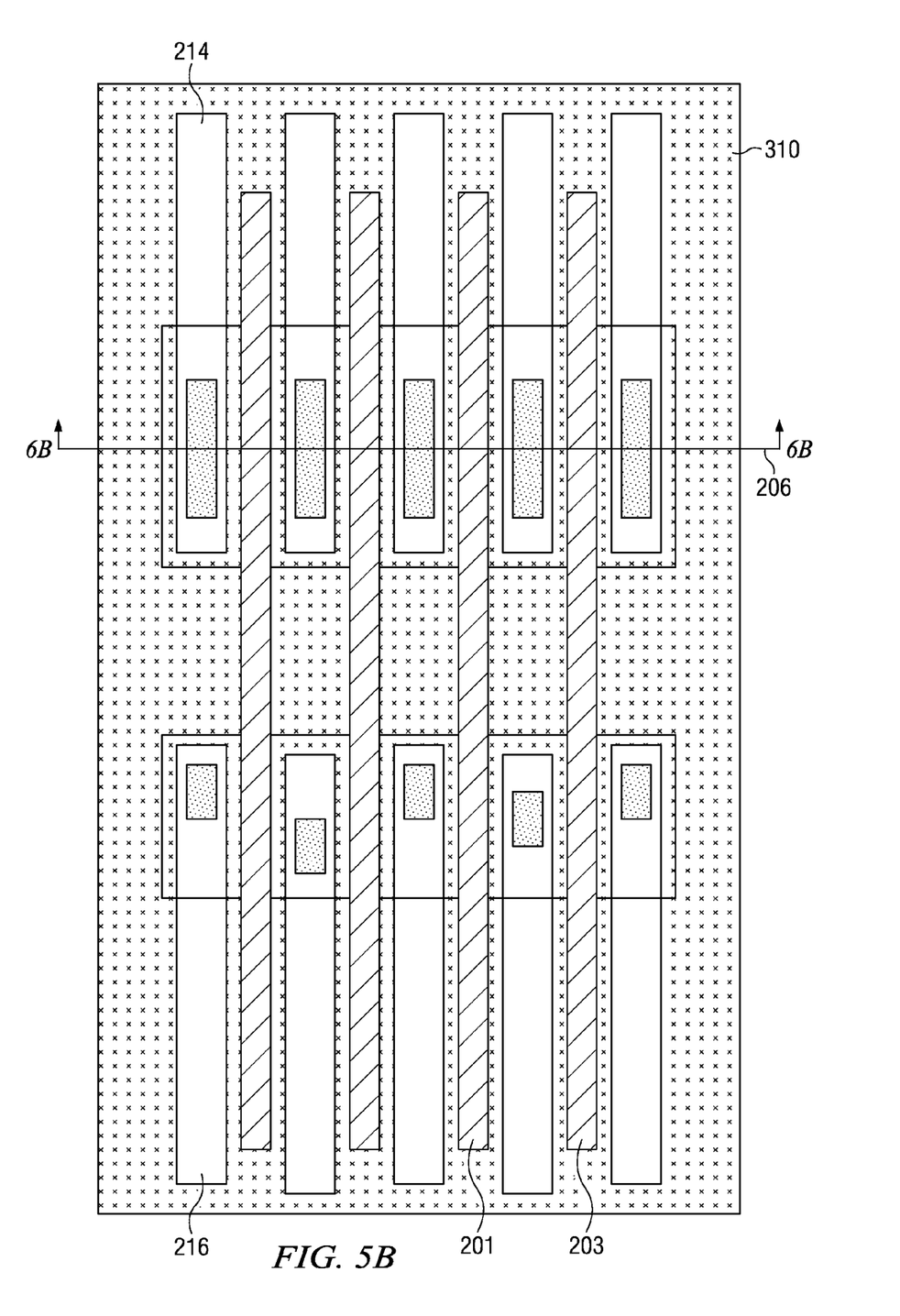
Figure 6B:
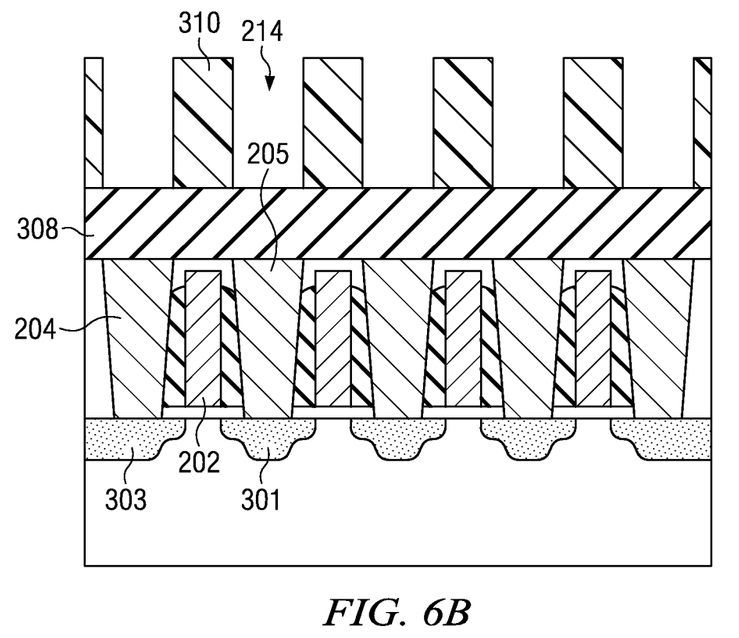
Figure 7B:
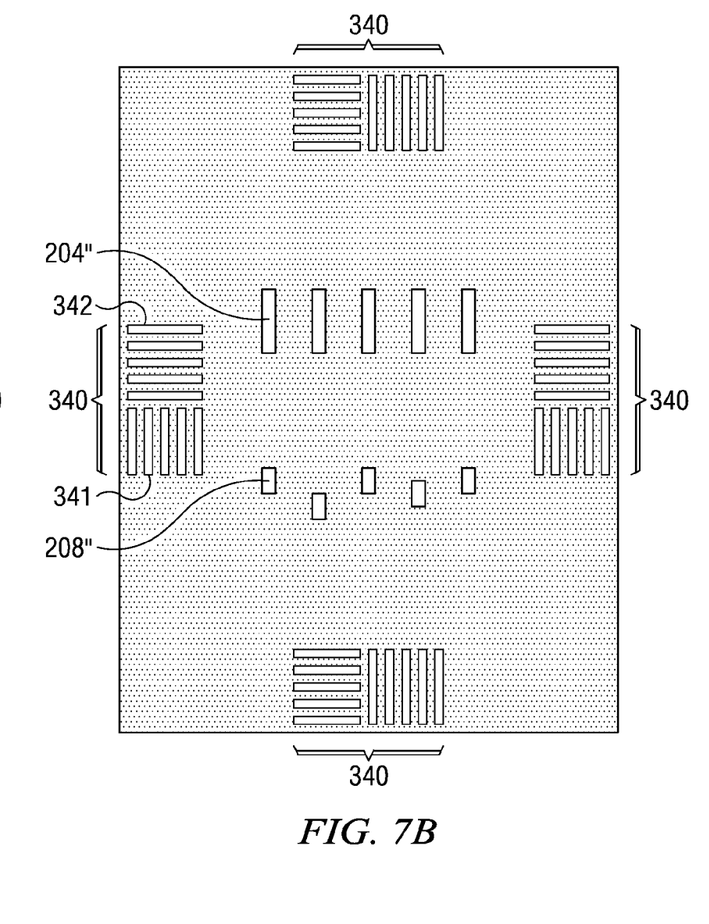
Figure 7C:
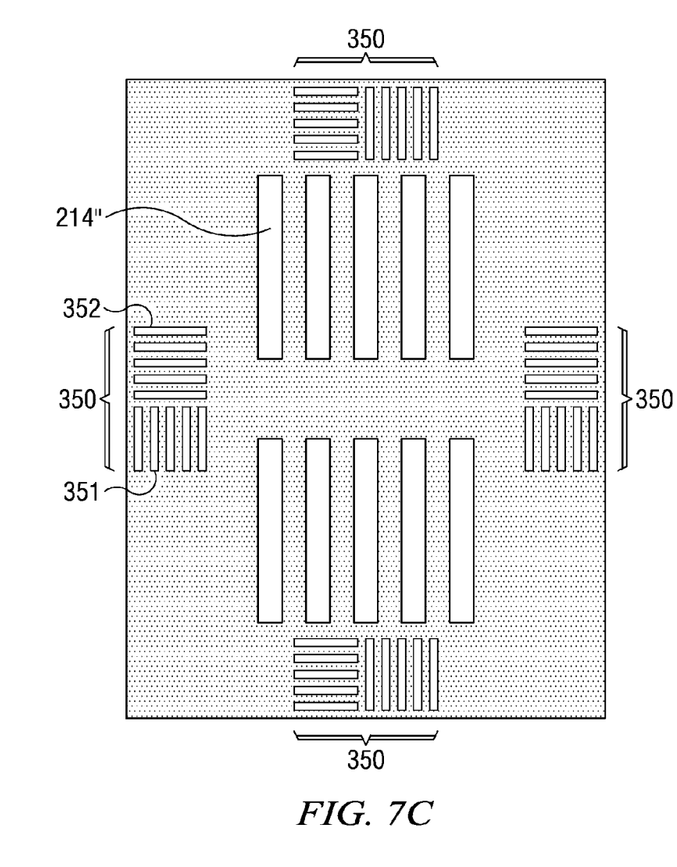

Referring to FIGS. 5B and 6B, a layer of dielectric 308 in which the first interconnect is to be formed using a damascene technique overlies the contacts 204 and 205. A first interconnect trench double pattern (geometries 214, 216) is formed in photoresist 310 on the dielectric layer 308. FIG. 7C illustrates a reticle having a first interconnect trench double pattern (geometries 214", 216") for forming geometries 214, 216 in photoresist 310. The first interconnect trench double pattern reticle includes alignment marks 350 that are used to align the reticle. Alignment marks 350 include x-alignment marks 351 and y-alignment marks 352. The x-direction alignment marks 351 of the first interconnect double pattern reticle (FIG. 7C) are aligned to the previously formed x-direction alignment marks 321 of the gate pattern (FIG. 7A) which are formed in gate material (e.g., polysilicon) on the integrated circuit wafer. The y-direction alignment marks 352 of the first interconnect double pattern reticle (FIG. 7C) are aligned to the previously formed y-direction alignment marks 342 of the contact pattern (FIG. 7B) which are formed on the integrated circuit wafer. In transferring the reticle geometries 214" and 216" to photoresist 310, alignment marks 351 and 352 are also transferred to the photoresist 310.

Figure 5C:
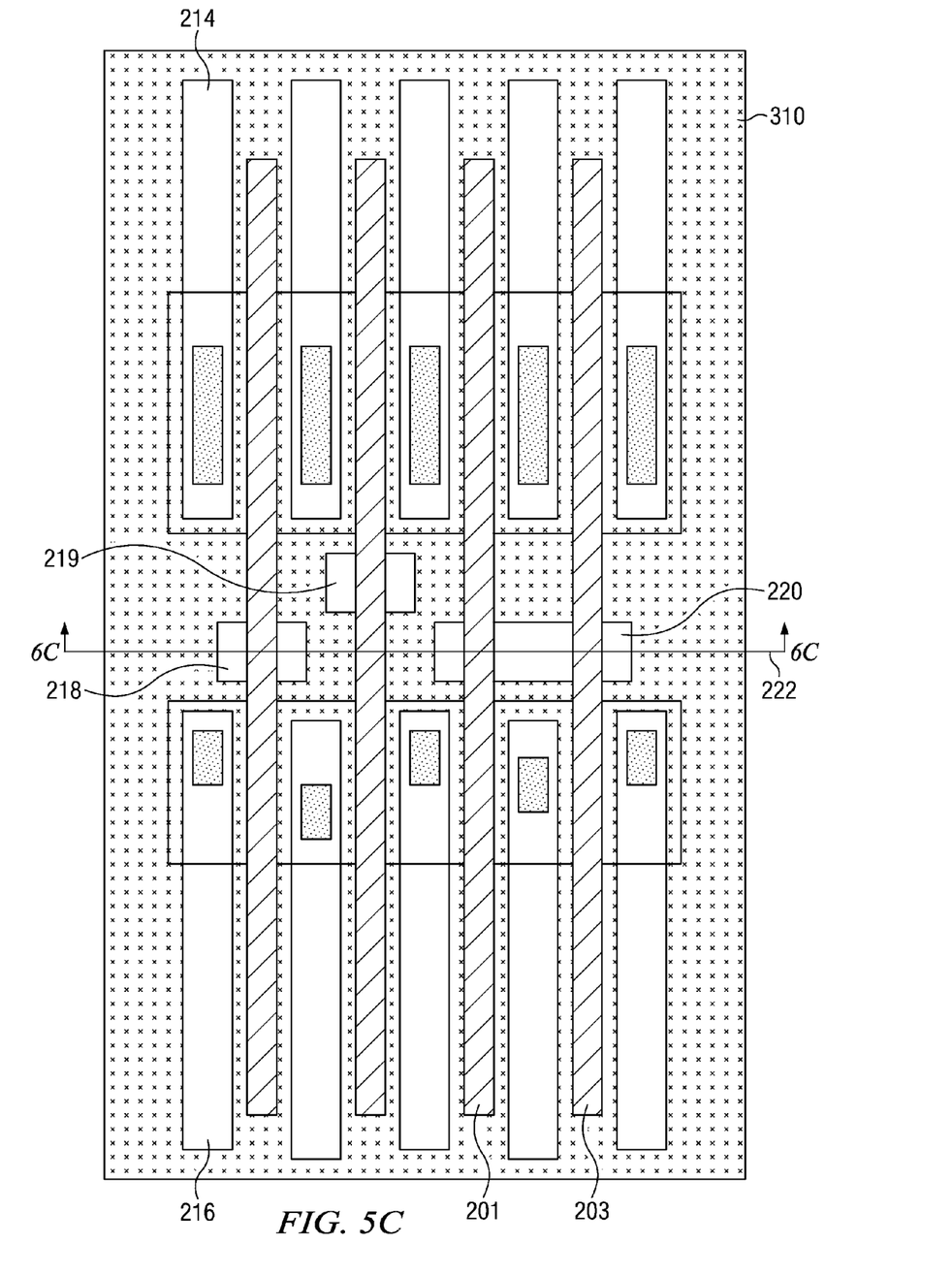
Figure 6C:
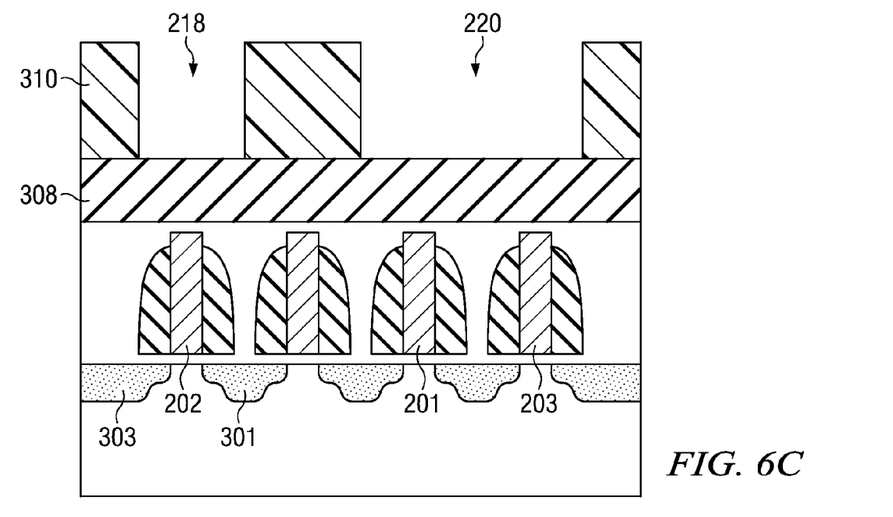
Figure 7D:
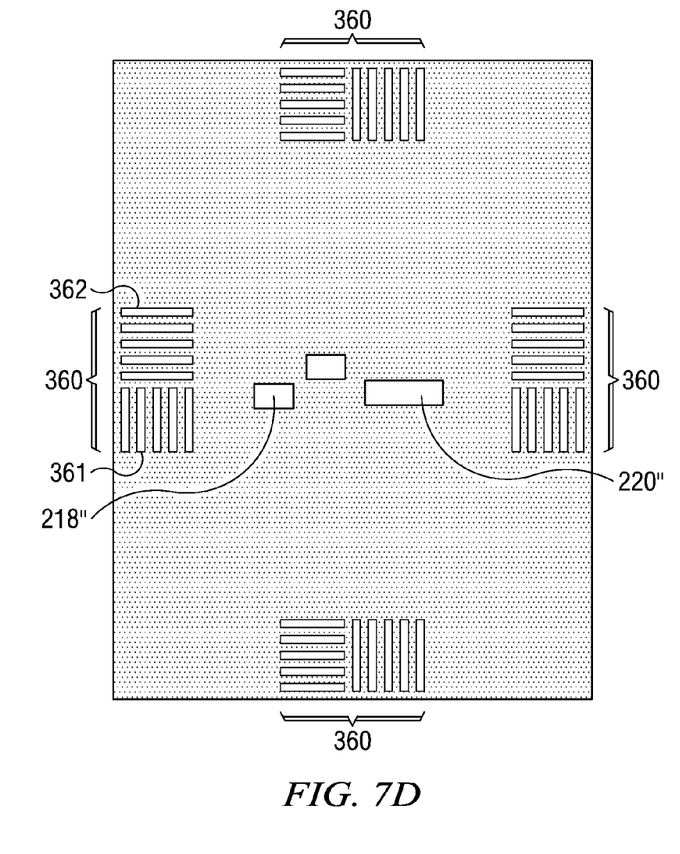

FIG. 5C shows a top down view of the integrated circuit with first interconnect geometries 214 and 216 and with second interconnect geometries 218, 219, 220 after a second interconnect trench double pattern is formed in photoresist 310 on the dielectric layer 308. The second interconnect trench double pattern (geometries 218, 219, 220 is printed into the same resist 310 as the first interconnect pattern (geometries 214, 216). FIG. 6C is a cross section through the second interconnect geometries 218 and 220 taken along line 222 in FIG. 5C. FIG. 7D illustrates a reticle having the second interconnect double pattern (geometries 218", 219", 220") for forming second interconnect geometries 218, 219, and 220. The x-direction alignment marks 361 of the second interconnect double pattern reticle (FIG. 7D) are aligned to the x-direction alignment marks 321 of the gate pattern (FIG. 7A) which are formed in the gate material (e.g. polysilicon) on the integrated circuit wafer. The y-direction alignment marks 362 of the second interconnect double pattern reticle (FIG. 7D) are aligned to the y-direction alignment marks 352 of the first interconnect double pattern (FIG. 7C) which are formed in photoresist layer 310 on the integrated circuit wafer.

Using the embodiment alignment method, the first interconnect double pattern reticle (FIG. 7C) is aligned in the x-direction to the gate (FIG. 5A, 7A) to avoid first interconnect to gate shorts and is aligned to the contacts (FIG. 5A, 7B) to avoid high contact resistance due to misalignment. Also using the embodiment alignment method, the second interconnect double pattern (FIG. 7D) is aligned in the x-direction to the gate pattern (FIG. 5A, 7A) to ensure good electrical connection to the gates and is aligned to the first interconnect double pattern (FIG. 5B, 7C) in the y-direction to avoid second interconnect double pattern geometry to first interconnect double pattern geometry shorting due to misalignment.

Figure 5D:
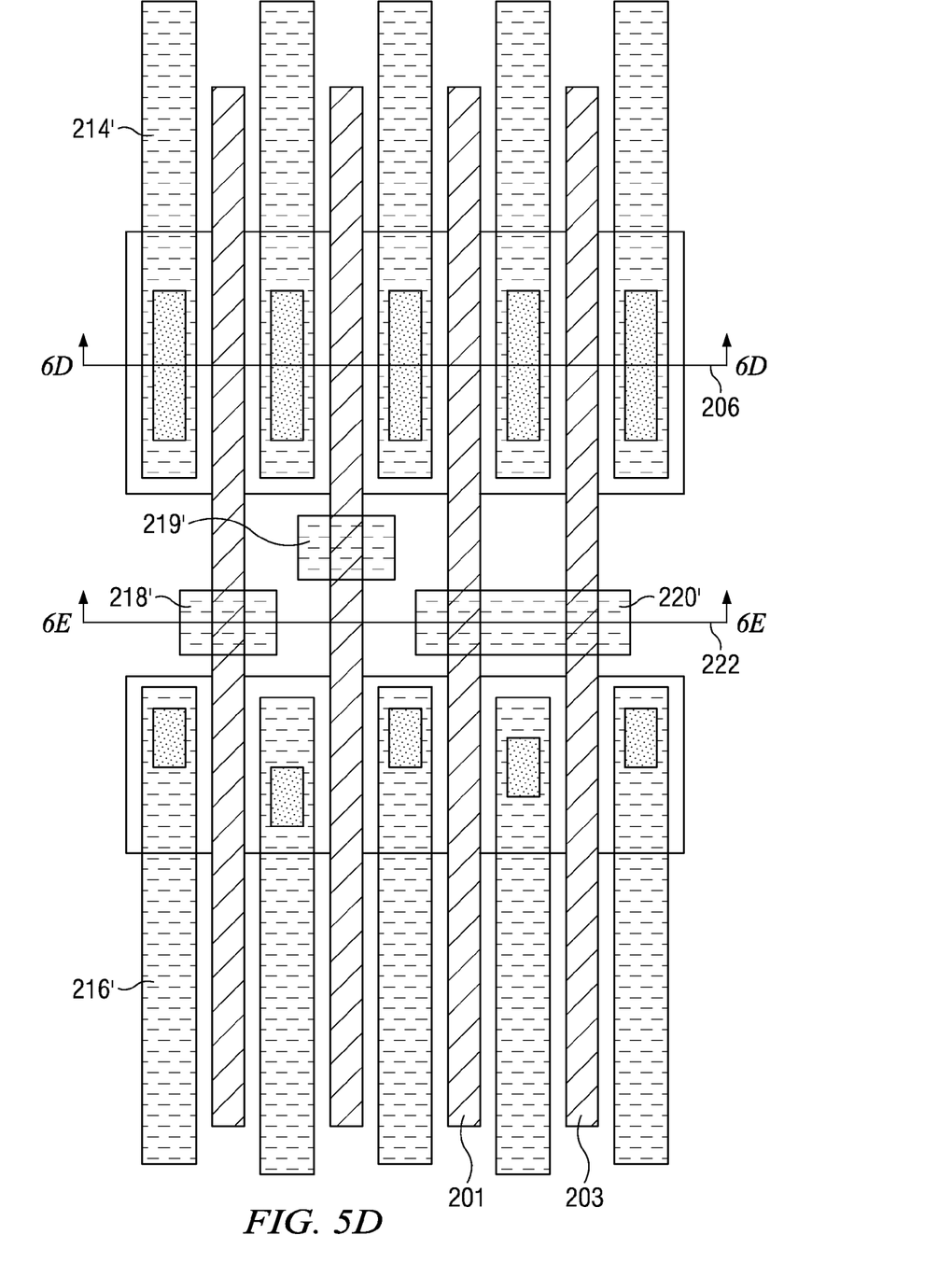
Figure 6D:
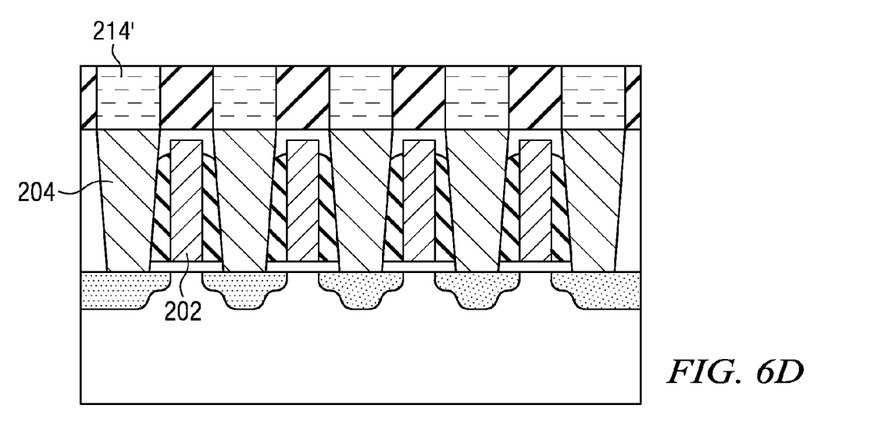

After first interconnect double pattern (FIG. 7C) and second interconnect double pattern (FIG. 7D) are printed in resist layer 310, the double pattern is etched into the underlying dielectric 310 and then filled with a first interconnect metal such as copper to form first interconnect trench geometries 214', 216' and second interconnect geometries 218,', 219', and 220' as shown in FIG. 5D. FIG. 6D is a cross section taken along line 206 in FIG. 5D after the first interconnect double pattern geometries 214' are etched into the underlying dielectric layer 308 and filled with metal.

Figure 6E:
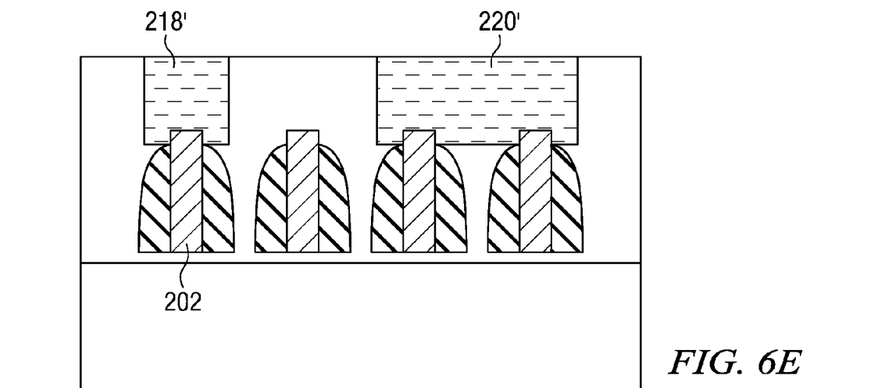

FIG. 6E is a cross section taken along line 222 in FIG. 5C after the second interconnect double pattern geometries 218' and 220' are etched into the underlying dielectric layer 308 and filled with metal.

Figure 8A:
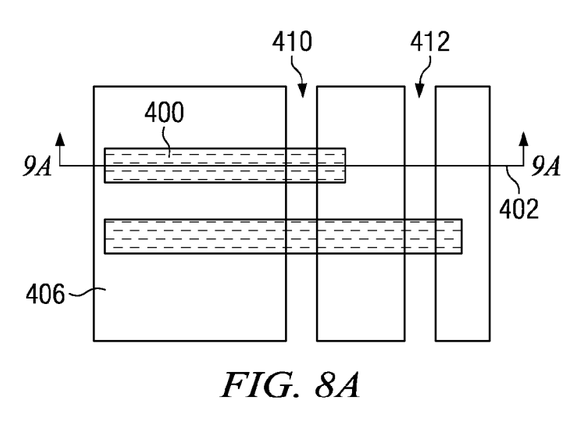
FIG. 8A-8C are top down pattern views illustrating alignment of a via pattern according to embodiments.
Figure 8B:
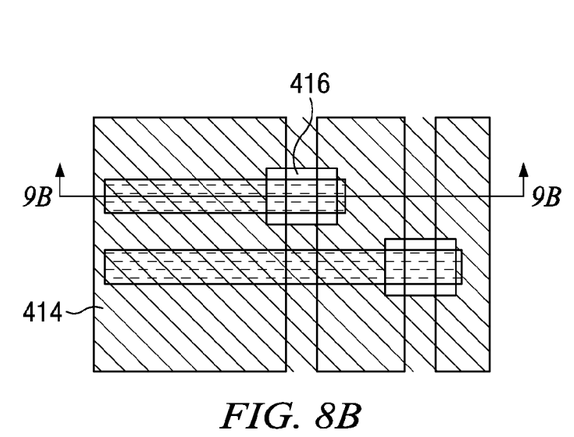
Figure 8C:
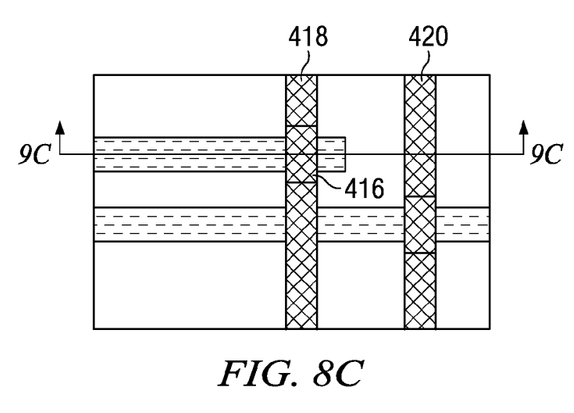
Figure 9A:
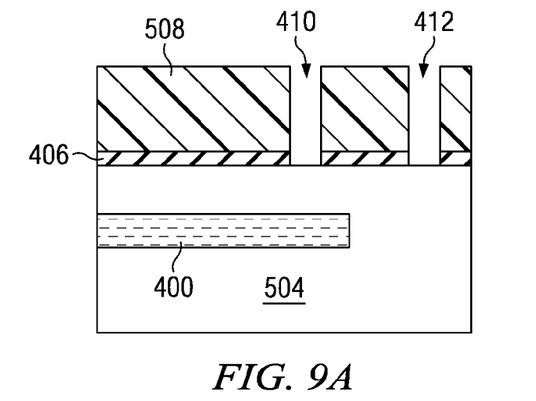
FIG. 9A-9C are cross section views illustrating alignment of a via pattern according to embodiments.
Figure 9B:
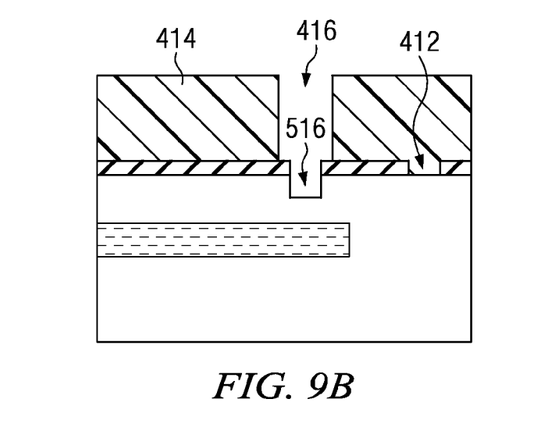
Figure 9C:
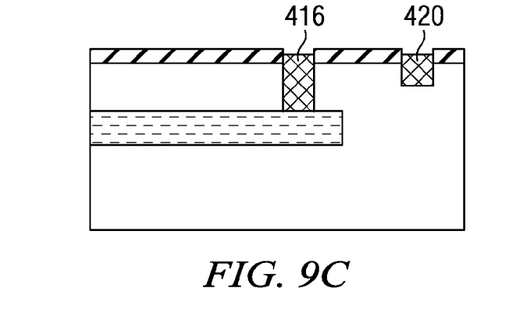
Figure 10A:
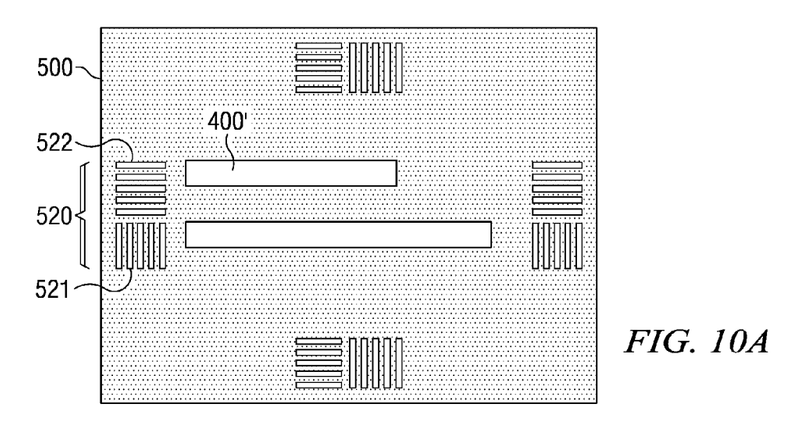
FIG. 10A-10C are integrated circuit pattern reticles with alignment marks.
Figure 10B:
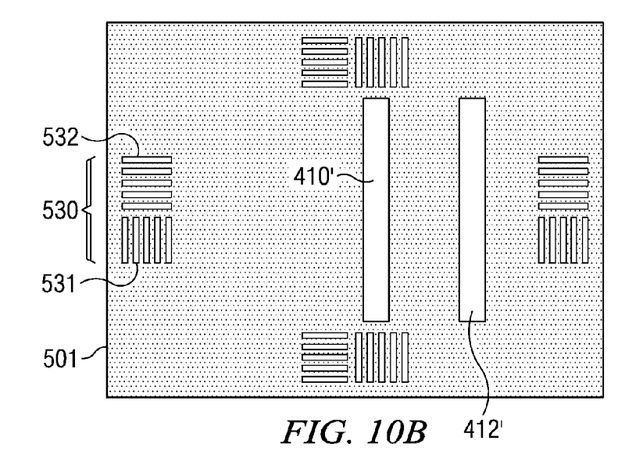
Figure 10C:
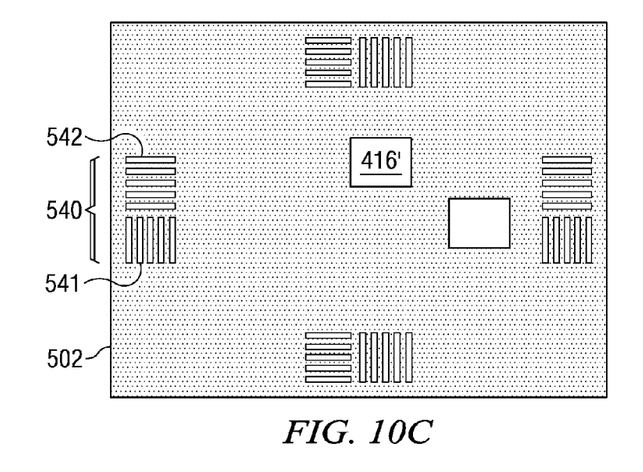

Another example alignment embodiment is illustrated in FIGS. 8A-8C, FIGS. 9A-9C, and FIGS. 10A through 10C. FIGS. 9A-9C are cross sections of the top down views in FIGS. 8A-8C. FIG. 10A shows the lower layer of interconnect pattern plus alignment marks, FIG. 10B shows the upper layer of interconnect pattern plus alignment marks and FIG. 10C shows the via pattern plus alignment marks.

In this embodiment the x-alignment marks 541 of via-(n) pattern (FIG. 10C) on the via-(n) reticle are aligned to the x-alignment marks 521 of the underlying interconnect-(n) (FIG. 10A) which are formed in underlying interconnect metal on the wafer and the y-alignment marks 542 (FIG. 10C) are aligned to the y-alignment marks 532 of the overlying interconnect-(n+1) (FIG. 10B) which are formed in the hardmask layer 406 on the wafer.

FIG. 8A shows a top down view of the integrated circuit after the formation of the upper interconnect-(n+1) photoresist pattern 508. FIG. 9A is a cross-section of FIG. 8A through line 402. Underlying interconnect 400 is formed in dielectric 504. Dielectric layer 504 may be a dielectric such as silicon dioxide or low-k dielectric. Interconnect 400 may be formed using an underlying interconnect reticle 500 such as that shown in FIG. 10A including interconnect pattern 400'. Underlying interconnect reticle 500 includes alignment marks 520 for aligning the reticle. Alignment marks 520 include x-alignment marks 521 and y-alignment marks 522. The process of forming interconnect 400 also transfers an image of alignment marks 520 to the underlying interconnect layer.

Hardmask layer 406 is formed over the dielectric layer 504. Upper interconnect-(n+1) photoresist pattern 508 with upper interconnect-(n+1) geometries 410 and 412 is formed on the hardmask layer 406 and the geometries 410 and 412 are etched into the hardmask layer 406. FIG. 10B illustrates a reticle 501 that may be used to form upper interconnect-(n+1) photoresist pattern 508. The upper interconnect reticle 501 includes geometries 410' and 412' that may be used to form geometries 410 and 412 in the photoresist pattern 508. Upper interconnect reticle 501 also includes alignment marks 530 for aligning the reticle. Alignment marks 530 include x-alignment marks 531 and y-alignment marks 532. The process of forming geometries 410 and 412 also transfers an image of alignment marks 530 to the integrated circuit. After etching geometries 410 and 412 into the hardmask 406, photoresist pattern 508 is removed.

In FIGS. 8B and 9B, via pattern 414 is then formed on the hardmask 406. Via pattern 414 includes via geometry 416. Via pattern 414 may be formed using a via reticle 502 such as that shown in FIG. 10C. Via reticle 502 includes a via geometry pattern 416' to form via geometry 416. Via reticle 502 also includes alignment marks 540 for aligning the reticle. Alignment marks 540 include x-alignment marks 541 and y-alignment marks 542. The x-direction alignment marks 541 of via pattern (FIG. 10C) are aligned to x-direction alignment marks 531 of the upper interconnect-(n+1) pattern (FIG. 10B) so that etched via 516 is self aligned in the x-direction to the upper interconnect layer (n+1) to ensure lowest possible via resistance to upper interconnect-(n+1). The y-direction alignment marks 542 of via pattern (FIG. 10C) are aligned to the y-direction alignment marks 522 of the lower interconnect-(n) layer-(n) (FIG. 10A) so that the via opening completely covers the lower interconnect-(n) geometry 400 to ensure the lowest possible via resistance to the lower interconnect-(n). Via 516 is partially etched into the dielectric layer 504. Via 516 is self aligned to the upper interconnect pattern (FIG. 10B) in the hardmask 406 as shown in FIG. 9B.

Referring now to FIG. 9C after the via pattern 414 is removed, the upper interconnect-(n+1) trenches, 418 and 420, are etched into the dielectric 504. During etching of the upper interconnect-(n+1) trenches, 418 and 420, the partially etched via 516 is etched through the dielectric layer 504 to make contact with the lower interconnect-(n) layer 400. Misalignment of the via opening 516 to the lower interconnect-(n) 400 in the y-direction or misalignment of the via opening 516 to the upper interconnect-(n+1) 418 in the x-direction may result in the via 516 partially covering one of the interconnects resulting in higher via resistance, functional or reliability failures, and lower yield. Aligning the via pattern (FIG. 10C) to the most critical direction (y) lower interconnect-(n) (FIG. 10A) y alignment marks 522 and to the most critical direction (x) upper interconnect-(n+1) (FIG. 10B) x alignment marks 531 assures minimum via resistance and maximum via yield and reliability. Trenches 418, 420 and via 516 are then filled with metal, for example copper.

Figure 11A:
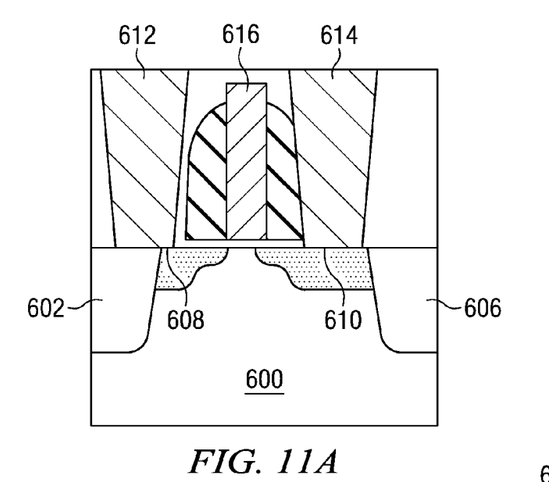
FIG. 11A-11C are cross section views illustrating alignment of a contact pattern according to embodiments.
Figure 11B:
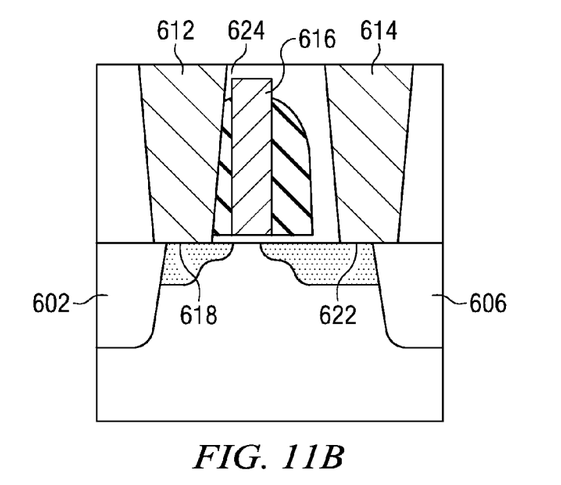
Figure 11C:
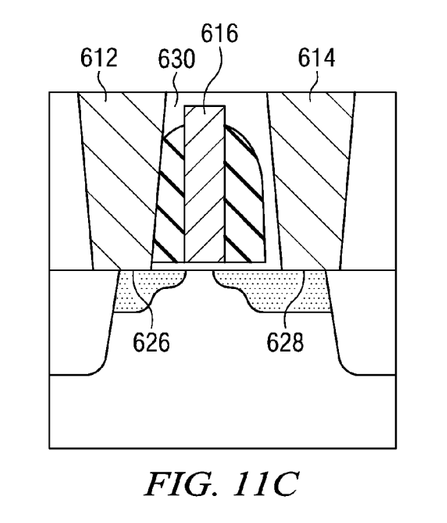

In the embodiment illustrated in FIG. 11A-11C, alignment marks of a pattern being printed may be aligned to the alignment marks of two previously defined patterns in the same direction. In FIG. 11A, the transistor gate 616 may be misaligned to the previously defined active pattern so that the space between the gate 616 and shallow trench isolation (STI) geometry 602 is less than between the gate 616 and STI geometry 606. If the contact pattern is aligned solely to the gate 616 alignment marks and is also misaligned slightly as shown in FIG. 6A, the overlap of the contact to diffusion 608 on one side of the gate 616 may be reduced causing high contact resistance whereas the overlap 610 of the contact 614 to diffusion the other side of the gate may be more that adequate.

Alignment of the contact pattern to previously defined diffusion alignment marks as shown in FIG. 11B may give sufficient contact, 612 and 614, overlap of diffusion, 618 and 622, on both sides of the transistor gate 616, but may cause one of the contacts 612 to become too close to the gate 616 resulting in a contact to gate short 624.

As illustrated in FIG. 11C by aligning the contact pattern in the x-direction to both the previously defined gate pattern x alignment marks and also to the previously defined active pattern x alignment marks, a compromise alignment may be achieved which may provide more consistent contact overlap of diffusion 626 while also providing sufficient space 630 between the contact 612 and gate 616 to avoid shorts.

Figure 12A:
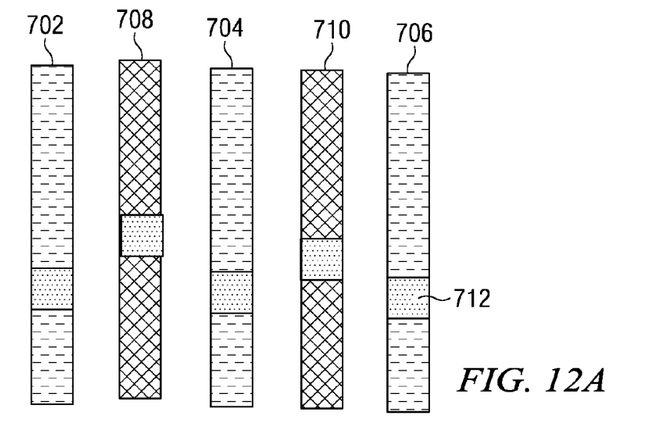
FIG. 12A-12C are cross section views illustrating alignment of a via pattern according to embodiments.
Figure 12B:
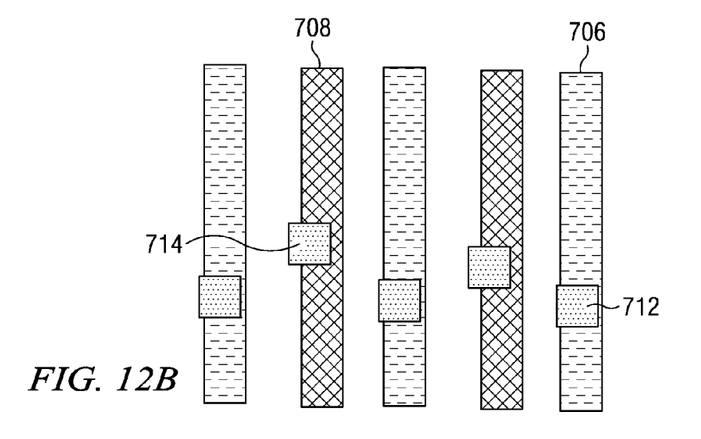
Figure 12C:
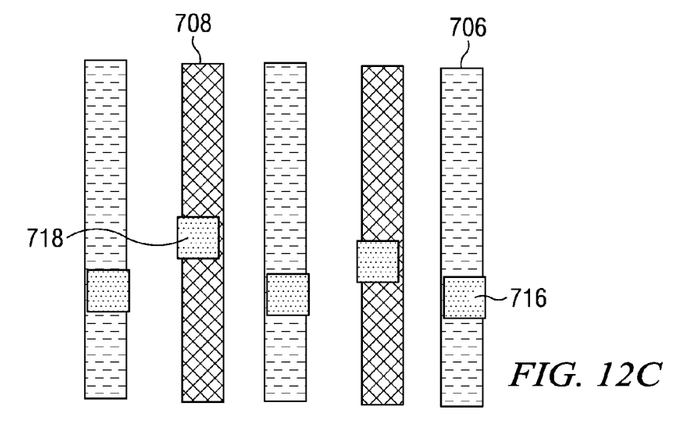

Another embodiment illustrating alignment to two previously defined patterns in the same direction is shown in FIG. 12A-12C. To achieve a tighter pitch, interconnect leads may be double printed using first and second interconnect double patterns. For example, as shown in FIG. 12A a first interconnect double pattern may print interconnect leads 702, 704, and 706 and a second interconnect double pattern may print interconnect leads 708 and 710. Later via pattern 712 may be printed.

As shown in FIG. 12B, the second interconnect double pattern geometries 708 and 710 may be slightly misaligned to the first interconnect double pattern geometries 702, 704, and 706 causing uneven spacing between the interconnect leads. If the via pattern 712 is aligned to the previously defined first interconnect double pattern in the x direction, the via 714 resistance to the second interconnect double patterned lead, 708, may be higher than to the via 712 resistance to first interconnect lead 706 due to more misalignment. The higher resistance may result in a circuit function or reliability failure.

As shown in FIG. 12C, by aligning the via pattern to both the previously defined first interconnect double and also to the previously defined second interconnect double pattern, a compromise alignment may be achieved which may result in a more equal via resistance 716 and 718 to the first interconnect lead, 706, and to the second interconnect lead 708.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating an integrated circuit, comprising:
   forming an interconnect-(n) patterned level having a first interconnect-(n) in an integrated circuit chip and a first alignment mark separate from the first interconnect-(n);
   forming a layer of photoresist having an interconnect-(n+1) pattern and a second alignment mark separate from the interconnect-(n+1) pattern; and
   aligning a reticle having a via-(n) pattern to the first alignment mark from the interconnect-(n) patterned level and to the second alignment mark in the layer of photoresist, wherein said reticle is aligned to the first alignment mark in a first direction and is aligned to the second alignment mark in a second direction, said new pattern is a via-(n) pattern, said first patterned level is an interconnect-(n) pattern level and said second patterned level is an interconnect-(n+1) pattern level.

2. A method of fabricating an integrated circuit, comprising:
   forming a first patterned level having a first pattern in an integrated circuit chip and a first alignment mark separate from the first pattern and outside of the integrated circuit chip;
   forming a second patterned level having a second pattern in the integrated circuit chip and a second alignment mark separate from the second pattern and outside of the integrated circuit chip;
   aligning a reticle having a new pattern to the first alignment mark from the first patterned level and to the second alignment mark from the second patterned level, wherein said reticle is aligned to the first alignment mark in a first direction and is aligned to the second alignment mark in a second direction, and wherein said first direction and said second direction are parallel directions, wherein said new pattern is a via-(n) pattern, said first patterned level is a first interconnect-(n) double pattern level and said second patterned level is a second interconnect-(n) double pattern level.

3. A method of fabricating an integrated circuit, comprising:
   using a first reticle to form a first patterned geometry in a first layer, wherein said first reticle includes a first alignment mark in a first direction that is transferred to said integrated circuit;
   using a second reticle to form a second patterned geometry in a second layer, wherein said second reticle includes a second alignment mark in said first direction that is transferred to said integrated circuit;
   aligning a third reticle to said first alignment mark and to said second alignment mark; and
   using said third reticle to form a third patterned geometry, wherein said third patterned geometry is a via pattern, where said first patterned geometry is a first interconnect double, and where said second patterned geometry is a second interconnect double pattern.

* * * * *